United States Patent
Yoon

(10) Patent No.: US 7,883,923 B2
(45) Date of Patent: *Feb. 8, 2011

(54) METHOD FOR MANUFACTURING IMAGE SENSOR

(75) Inventor: Joon-Ku Yoon, Suwon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/344,448

(22) Filed: Dec. 26, 2008

(65) Prior Publication Data

US 2009/0166775 A1 Jul. 2, 2009

(30) Foreign Application Priority Data

Dec. 27, 2007 (KR) ...................... 10-2007-0139446

(51) Int. Cl.
*H01L 21/00* (2006.01)

(52) U.S. Cl. .............................. 438/60; 438/57; 438/59; 438/69; 438/73; 438/74; 438/75; 438/144

(58) Field of Classification Search ................... 438/57, 438/59, 60, 69, 73–75, 144
See application file for complete search history.

(56) References Cited

U.S. PATENT DOCUMENTS

| | | | | |
|---|---|---|---|---|
| 5,936,261 A | * | 8/1999 | Ma et al. ...................... 257/59 |
| 6,215,164 B1 | * | 4/2001 | Cao et al. ..................... 257/431 |
| 6,759,262 B2 | * | 7/2004 | Theil et al. ..................... 438/48 |
| 6,841,411 B1 | * | 1/2005 | Varghese ...................... 438/94 |
| 7,101,726 B2 | * | 9/2006 | Yamamoto et al. ............. 438/69 |
| 7,482,646 B2 | * | 1/2009 | Gao et al. ..................... 257/292 |
| 2003/0057357 A1 | * | 3/2003 | Uppal et al. ............. 250/208.1 |
| 2005/0088551 A1 | * | 4/2005 | Lee et al. ..................... 348/272 |
| 2005/0179063 A1 | * | 8/2005 | Yaung et al. ................. 257/213 |

* cited by examiner

*Primary Examiner*—Michael Trinh
*Assistant Examiner*—Bac H Au
(74) *Attorney, Agent, or Firm*—Sherr & Vaughn, PLLC

(57) ABSTRACT

Embodiments relate to an image sensor and a method for manufacturing an image sensor. According to embodiments, a method may include forming a semiconductor substrate including a pixel part and a peripheral part, forming an interlayer dielectric film including a metal wire on and/or over the semiconductor substrate, forming photo diode patterns on and/or over the interlayer dielectric film and connected to the metal wire in the pixel part, forming a device isolation dielectric layer on and/or over the interlayer dielectric film including the photo diode patterns, forming a first via hole on and/or over the device isolation dielectric layer to partially expose the photo diode patterns, and forming a second via hole on and/or over the device isolation dielectric layer to expose the metal wire in the peripheral part. According to embodiments, vertical integration of transistor circuitry and a photo diode may be achieved.

11 Claims, 5 Drawing Sheets

METHOD FOR MANUFACTURING IMAGE SENSOR

Figure 1:
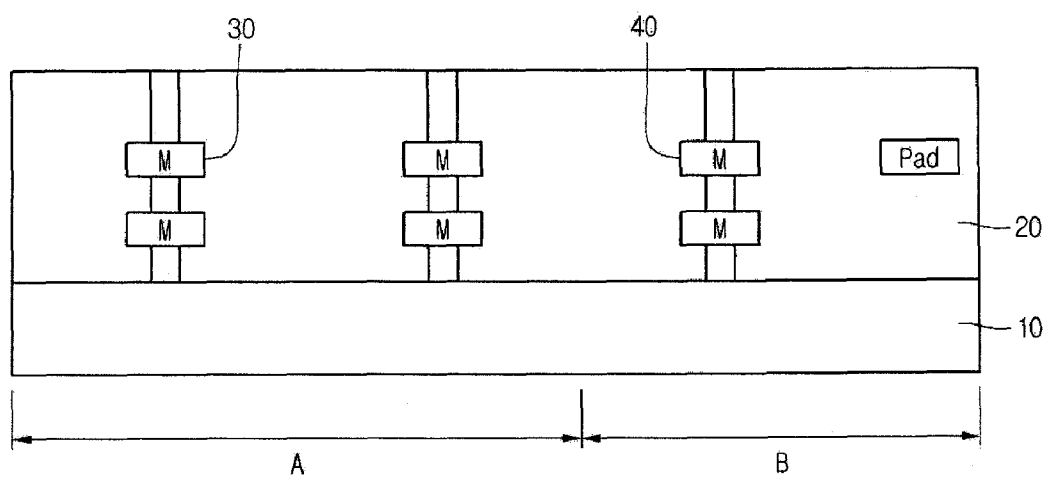

The present application claims priority under 35 U.S.C. 119 to Korean Patent Application No. 10-2007-0139446 (filed on Dec. 27, 2007), which is hereby incorporated by reference in its entirety.

BACKGROUND

An image sensor may be a semiconductor device that converts an optical image into an electrical signal. Image sensors may be classified into categories, such as a charge coupled device (CCD) image sensor and a complementary metal oxide silicon (CMOS) image sensor (CIS).

A CIS may include a photo diode and a MOS transistor formed in a unit pixel. A CIS may obtain an image by sequentially detecting electrical signals of unit pixels in a switching manner. In a CIS structure, a photo diode region may convert a light signal to an electrical signal, and a transistor may process the electrical signal. A CMOS image sensor may include a photodiode and a MOS transistor within a unit pixel to sequentially detect electrical signals of each unit pixel, implementing an image. A photo diode region and a transistor may be horizontally arranged in a semiconductor substrate.

In a horizontal type CIS according to the related art, a photo diode and a transistor may be horizontally formed adjacent to each other on and/or over a substrate. Therefore, an additional region for forming a photo diode may be required.

SUMMARY

Embodiments relate to a semiconductor device and to a method for manufacturing a semiconductor device. Embodiments relate to an image sensor and to a method for manufacturing an image sensor.

Embodiments relate to a method for manufacturing an image sensor which may provide a vertical integration of a transistor circuitry and a photo diode. Embodiments relate to a method of manufacturing an image sensor which may improve both a resolution and sensitivity.

Embodiments relate to a method for manufacturing an image sensor which may prevent generation of defects in a photo diode, while implementing a vertical photo diode structure.

According to embodiments, a method for manufacturing an image sensor may include at least one of the following. Forming a semiconductor substrate including a pixel part and a peripheral part. Forming an interlayer dielectric film including a metal wire on and/or over the semiconductor substrate. Forming photo diode patterns on and/or over the interlayer dielectric film to be connected to the metal wire in the pixel part and isolated from each other by a device isolation trench. Forming a device isolation dielectric layer on and/or over the interlayer dielectric film including the device isolation trench and photo diode patterns. Forming a first via hole on and/or over the device isolation dielectric layer so that the photo diode patterns may be partially exposed. Forming a second via hole on the device isolation dielectric layer so that the metal wire in the peripheral part is exposed.

DRAWINGS

Example FIGS. 1 through 9 are cross-sectional views illustrating an image sensor and processes of a method for manufacturing an image sensor, according to embodiments.

DESCRIPTION

Example FIGS. 1 to 9 are cross-sectional views illustrating an image sensor and processes of a method for manufacturing an image sensor, according to embodiments. Referring to example FIG. 1, bottom metal wires 30 and 40 and interlayer dielectric film 20 may be formed on and/or over semiconductor substrate 10.

Semiconductor substrate 10 may be a single crystal or poly crystal silicon substrate, and may be a substrate doped with a p type impurity or an n type impurity. According to embodiments, a device isolation film, which may define an active area and a field area, may be formed in semiconductor substrate 10. According to embodiments, circuitries of pixel part A and peripheral part B may be formed on and/or over an active area.

According to embodiments, a transistor circuitry may be formed on and/or over pixel part A, and may include a reset transistor, a drive transistor, a select transistor, and a transfer transistor. These transistors may convert received photocharges into electrical signals, and may be connected to a photo diode. Transistors may be formed for each pixel unit.

Interlayer dielectric film 20 may include bottom metal wires 30 and 40, and may be formed on and/or over a top of pixel part A and peripheral part B of semiconductor substrate 10. Bottom metal wires 30 and 40 may connect power lines or signal lines to the circuitries. According to embodiments, interlayer dielectric film 20 may be formed as multi layers.

Bottom metal wires 30 and 40 may include metal wires M and plugs. Bottom metal wires 30 that may be formed on and/or over pixel part A may be formed for each pixel unit. This may enable a transfer of photocharges of a photo diode to circuitry.

Bottom metal wires 30 and 40 may include various conductive materials including at least one of metal, alloys, and silicide. According to embodiments, bottom metal wires 30 and 40 may include aluminum, copper, cobalt or tungsten. According to embodiments, plugs of bottom metal wires 30 and 40 may be exposed at a surface of interlayer dielectric film 20. According to embodiments, when forming bottom metal wires 30 and 40, a pad may be formed on and/or over peripheral part B.

Figure 2:
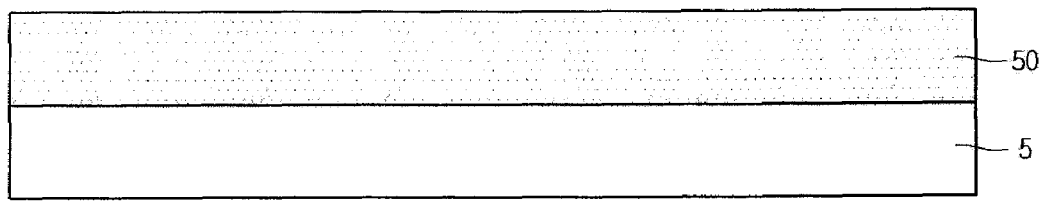

Referring to example FIG. 2, crystalline semiconductor substrate 5 may be provided. Crystalline semiconductor substrate 5 may be a single crystal or poly crystal silicon substrate, and may be a substrate doped with a p type impurity or an n type impurity. According to embodiments, crystalline semiconductor substrate 5 may be a p type substrate. According to embodiments, crystalline semiconductor substrate 5 may be formed having substantially a same size as semiconductor substrate 10. According to embodiments, an epi-layer may be formed in crystalline semiconductor substrate 5.

According to embodiments, photo diode 50 may be formed inside crystalline semiconductor substrate 5. Photo diode 50 may include an n type impurity area and a p type impurity area. Photo diode 50 may be formed to have a PN junction where an n type impurity and a p type impurity may be joined together.

Figure 3:
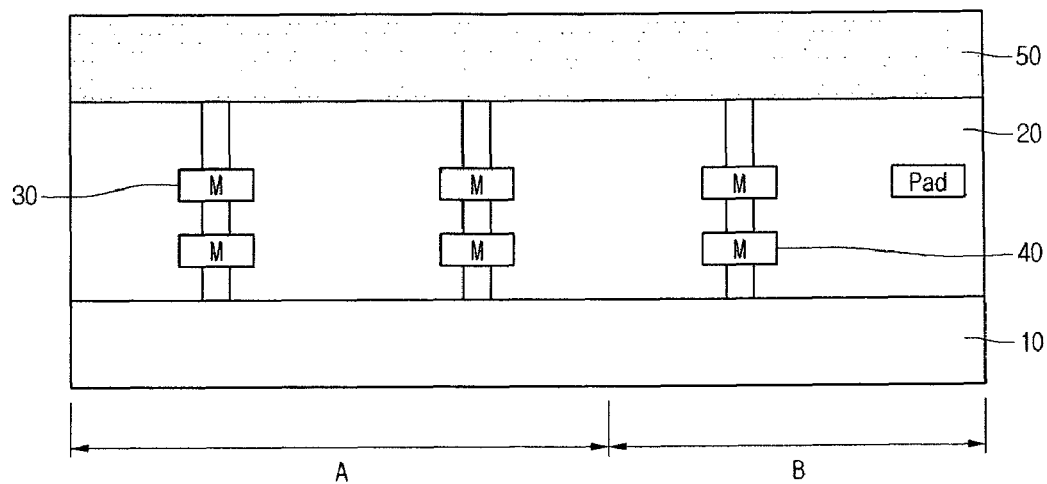

Referring to example FIG. 3, photo diode 50 may be formed on and/or over interlayer dielectric film 20 of semiconductor substrate 10. Semiconductor substrate 10 may be coupled to crystalline semiconductor substrate 5 including photo diode 50. According to embodiments, semiconductor substrate 10 may be coupled to crystalline semiconductor substrate 5 through a bonding process.

According to embodiments, a surface of photo diode 50 of crystalline semiconductor substrate 5 may be positioned on and/or over interlayer dielectric film 20, which may be on and/or over a surface of semiconductor substrate 10. A bonding process may then join them to each other. If semiconductor substrate 10 is coupled to crystalline semiconductor substrate 5, plugs of bottom metal wires 30 and 40 may be electrically connected to photo diode 50 of crystalline semiconductor substrate 5.

According to embodiments, crystalline semiconductor substrate 5 may be removed. Photo diode 50 may remain on and/or over semiconductor substrate 10. According to embodiments, if crystalline semiconductor substrate 5 is removed, only photo diode 50 may remain on and/or over semiconductor substrate 10. According to embodiments, crystalline semiconductor substrate 5 may be removed by an etching process or a chemical mechanical polishing (CMP) process.

According to embodiments, photo diode 50 may remain on and/or over semiconductor substrate 10, and semiconductor substrate 10 and photo diode 50 may form a vertical integration.

Figure 4:
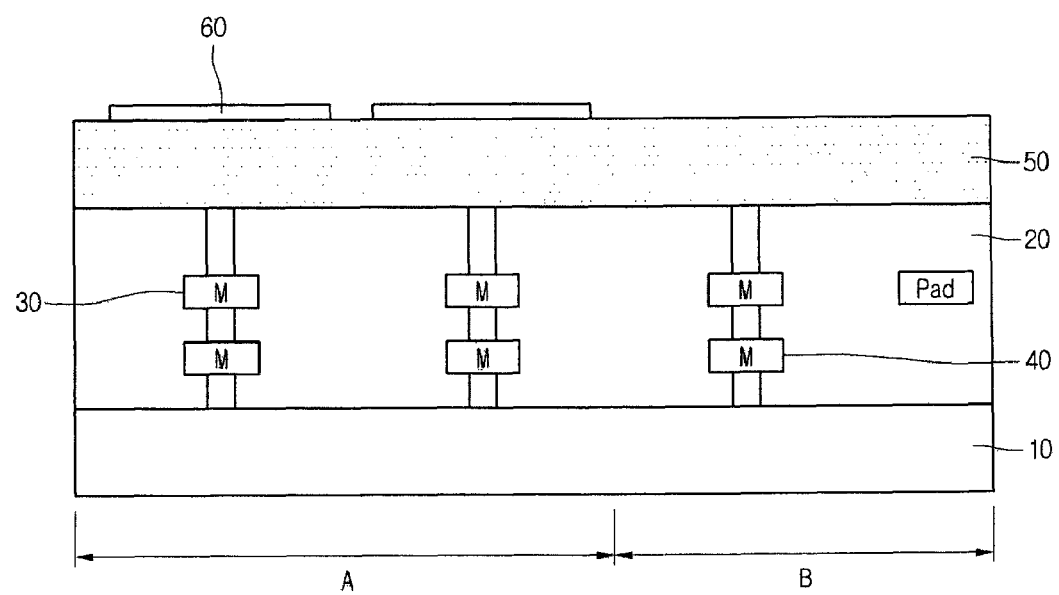

Referring to example FIG. 4, hard mask 60 may be formed on and/or over photo diode 50. Hard mask 60 may be used to classify photo diode 50 for each pixel unit. According to embodiments, hard mask 60 may include an oxide film including tetra ethyl ortho silicate (TEOS).

Hard mask 60 may be formed by forming a hard mask layer on and/or over photo diode 50. A patterning process may then be performed with a photoresist pattern. Hard mask 60 may be formed on and/or over photo diode 50 and may correspond to locations of bottom metal wire 30 in pixel part A. According to embodiments, hard mask 60 may be formed to have a wider area than an area of bottom metal wire 30.

Figure 5:
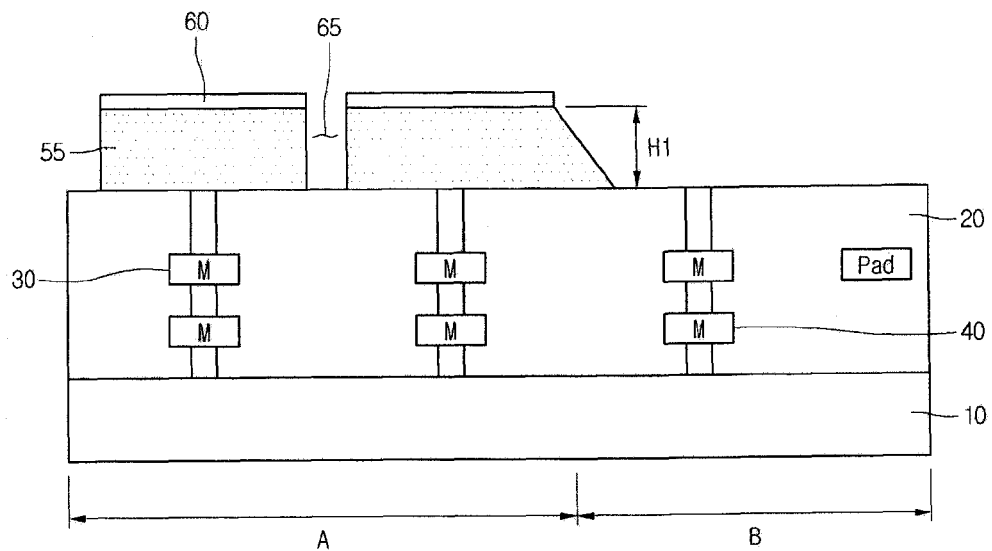

Referring to example FIG. 5, photo diode pattern 55 may be formed on and/or over interlayer dielectric film 20 corresponding to pixel part A. Photo diode pattern 55 may be formed by etching photo diode 50 using hard mask 60 as an etching mask. According to embodiments, photo diode 50 may be selectively removed and may form device isolation trench 65, which may expose interlayer dielectric film 20. According to embodiments, device isolation trench 65 may isolate photo diode 50 for each unit pixel and may thus be formed to have a relatively narrow width. According to embodiments, photo diode pattern 55 may be formed to maximize a width.

According to embodiments, photo diode pattern 55 may be connected to bottom metal wire 30 and may be defined by device isolation trench 65. According to embodiments, photo diode 50 in peripheral part B may be removed. A surface of interlayer dielectric film 20 in peripheral part B may thus be exposed. According to embodiments, if interlayer dielectric film 20 in peripheral part B is exposed, metal wire 40 in peripheral part B may be exposed. According to embodiments, hard mask 60 remaining on and/or over photo diode pattern 55 may not be removed. According to embodiments, hard mask 60 may alternatively be removed.

Photo diode pattern 55 may be formed on and/or over interlayer dielectric film 20 in pixel part A. According to embodiments, photo diode pattern 55 may have first height H1, which may be higher than a height of interlayer dielectric film 20 in peripheral part B. According to embodiments, a step may occur in interlayer dielectric film 20 by a height of photo diode pattern 55. According to embodiments, a step between photo diode pattern 55 and interlayer dielectric film 20 in peripheral part B may be approximately 1.2 to 2.0 μm.

Figure 6:
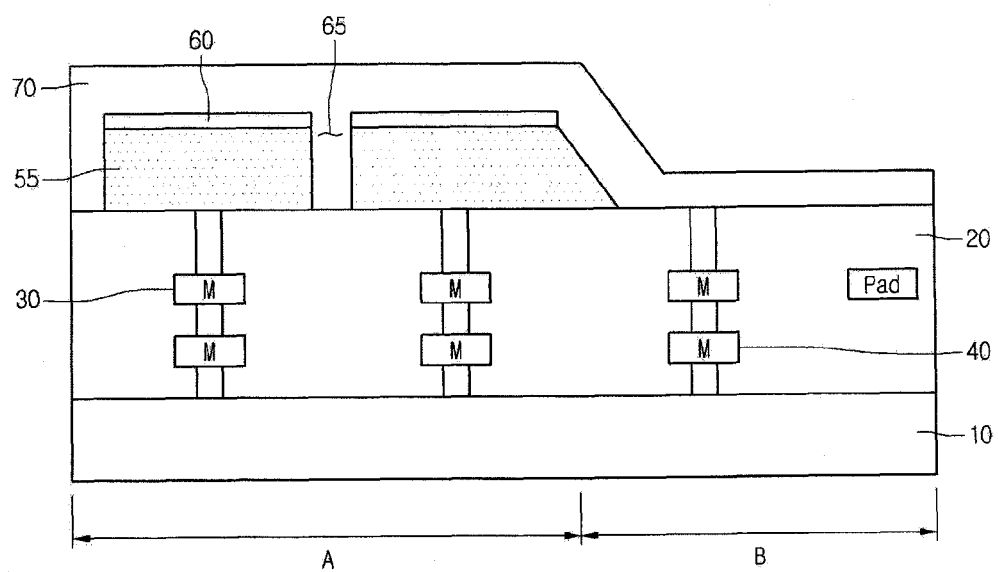

Referring to example FIG. 6, device isolation dielectric layer 70 may be formed on and/or over interlayer dielectric film 20 including photo diode pattern 55 and device isolation trench 65. Device isolation dielectric layer 70 may be formed on and/or over interlayer dielectric film 20 and may cover all photo diode pattern 55 and device isolation trench 65.

Device isolation dielectric layer 70 may be formed to fill device isolation trench 65. According to embodiments, photo diode pattern 55 may be isolated by device isolation dielectric layer 70 for each unit pixel. According to embodiments, device isolation dielectric layer 70 may include an oxide film.

Device isolation dielectric layer 70 may be uniformly deposited on and/or over photo diode pattern 55 and interlayer dielectric film 20. According to embodiments, device isolation dielectric layer 70 may have a step corresponding to heights of photo diode pattern 55 and interlayer dielectric film 20 in peripheral part B.

To apply electrical signals to photo diode pattern 55, device isolation dielectric layer 70 may be selectively removed. According to embodiments, to transfer electrical signals to bottom metal wire 40 in peripheral part B, device isolation dielectric layer 70 may also be selectively removed. To expose photo diode pattern 55 and bottom metal wire 40, device isolation dielectric layer 70 may be selectively removed using a photolithography process. If a step occurs in device isolation dielectric layer 70 by photo diode pattern 55 as described above, a photolithography process to expose photo diode pattern 55 and bottom metal wire 40 simultaneously may not be performed exactly. During an exposure process of lithography, a portion of a photoresist film may be in focus as an exact target to be exposed, but other areas that may have a step may be out of focus and may not be exposed.

Alternatively, a portion of a photoresist film may be in focus to be exactly exposed, but other areas may be missed from an exact target point. In other words, since a step may occur between photo diode pattern 55 and interlayer dielectric film 20 of peripheral part B, it may be difficult to perform a photo process to expose photo diode pattern 55 and interlayer dielectric film 20.

According to embodiments, photo processes for forming via holes exposing photo diode pattern 55 and interlayer dielectric film 20 may be performed separately.

Figure 7:
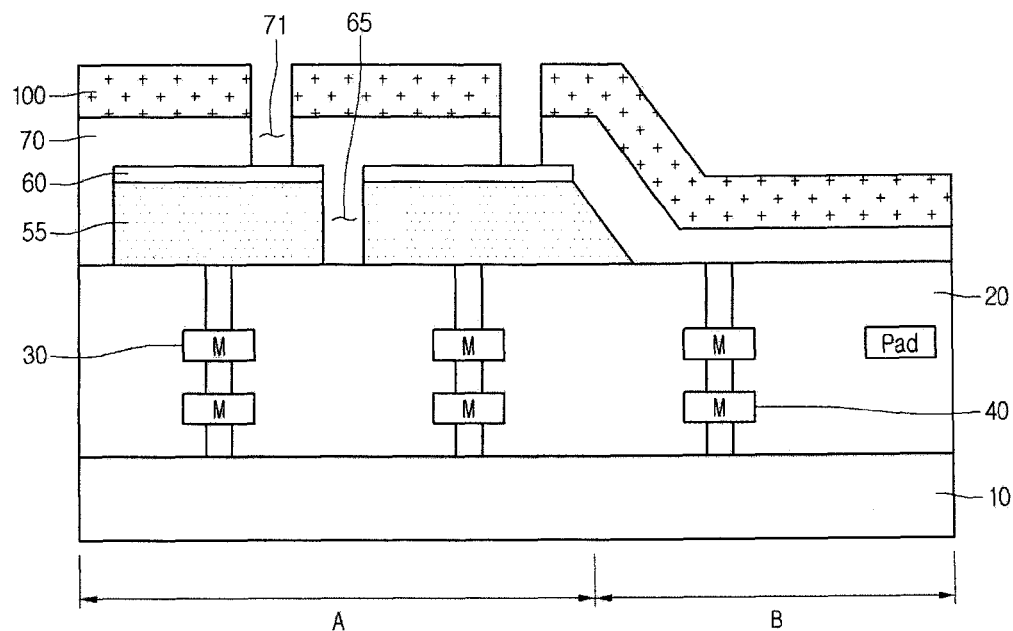

Referring to example FIG. 7, first via hole 71 may be formed in device isolation dielectric layer 70. According to embodiments, first via hole 71 may partially expose photo diode pattern 55. To form first via hole 71, first photoresist pattern 100 may be formed on and/or over device isolation dielectric layer 70. First photoresist pattern 100 may be formed by coating a photoresist film on and/or over device isolation dielectric layer 70. Exposure and development processes may then be performed. First photoresist pattern 100 may be formed to selectively expose device isolation dielectric layer 70 corresponding to photo diode pattern 55 and may cover all other areas.

According to embodiments, device isolation dielectric layer 70 may be etched using first photoresist pattern 100 as an etching mask. Device isolation dielectric layer 70, which may be exposed by first photoresist pattern 100, may be etched to form first via hole 71, which may expose photo diode pattern 55. According to embodiments, photo diode pattern 55 may be selectively exposed by first via hole 71. First photoresist pattern 100 may be removed through an ashing process.

Figure 8:
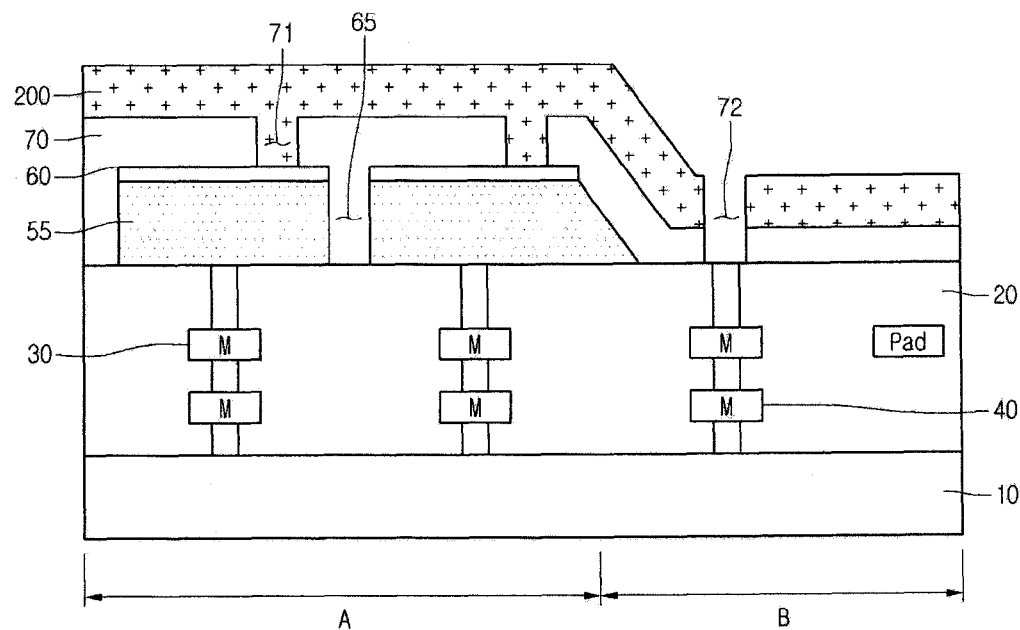

Referring to example FIG. 8, second via hole 72 may be formed in device isolation dielectric layer 70. Second via hole 72 may expose bottom metal wire 40 in peripheral part B. According to embodiments, to form second via hole 72, second photoresist pattern 200 may be formed on and/or over device isolation dielectric layer 70. Second photoresist pattern 200 may be formed by coating a photoresist film on and/or over device isolation dielectric layer 70. According to embodiments, exposure and development processes may then be performed. Second photoresist pattern 200 may be formed to selectively expose device isolation dielectric layer 70 corresponding to a location of bottom metal wire 40 of peripheral part B and may cover all other areas.

According to embodiments, device isolation dielectric layer 70 may be etched using second photoresist pattern 200 as an etching mask. Device isolation dielectric layer 70 exposed by second photoresist pattern 200 may be etched and may form second via hole 72, which may expose bottom metal wire 40. According to embodiments, bottom metal wire 40 may be exposed by second via hole 72. Second photoresist pattern 200 may be removed through an ashing process.

Figure 9:
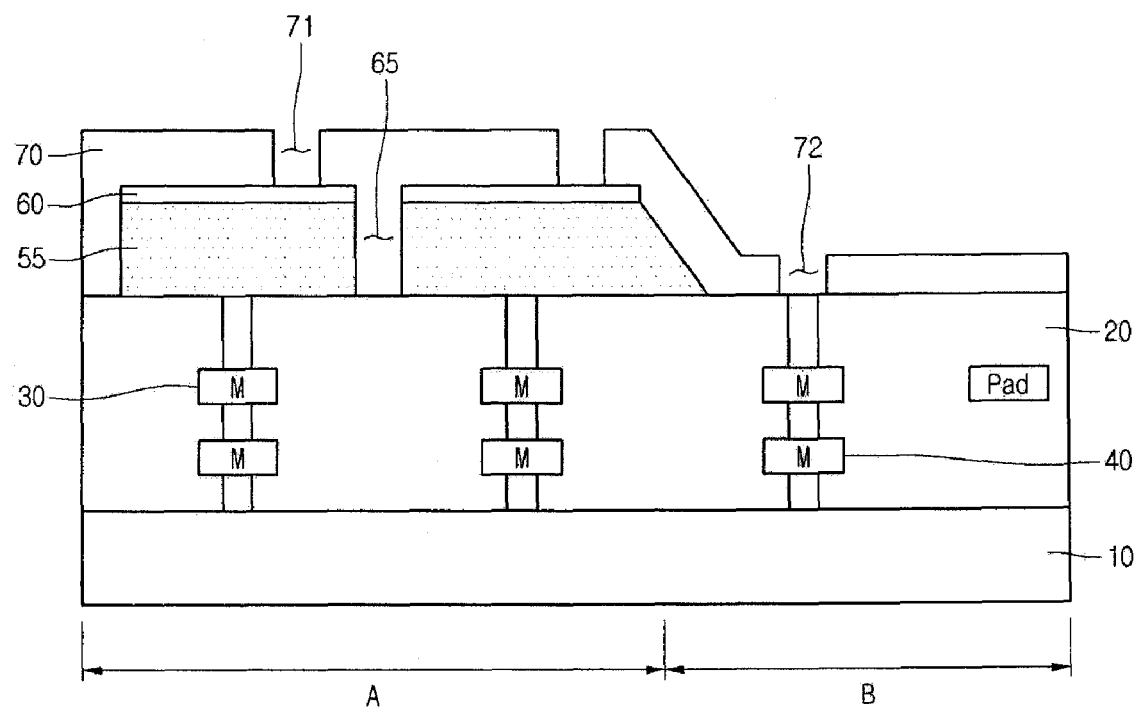

Referring to example FIG. 9, first via hole 71 and second via hole 72 may be formed on and/or over device isolation dielectric layer 70. First via hole 71 may expose at least a portion of photo diode pattern 55 and second via hole 72 may expose bottom metal wire 40 in peripheral part B.

According to embodiments, a top metal wire layer may be formed on and/or over device isolation dielectric layer 70, including first and second via holes 71 and 72, which may allow electrical signals to be provided to photo diode pattern 55 and bottom metal wire 40. According to embodiments, a color filter and a micro lens may be formed on and/or over device isolation dielectric layer 70.

According to embodiments, a pattering process may be performed twice to expose photo diode pattern 55 and metal wire 40 in peripheral part B. Photo and etching processes may then be substantially exactly performed, regardless of a step between photo diode pattern 55 and interlayer dielectric film 20 in peripheral part B. According to embodiments, first via hole 71, which may expose photo diode pattern 55, and second via hole 72, which may expose bottom metal wire 40, may be formed on and/or over device isolation dielectric layer 70, respectively.

According to embodiments, a photo diode may be formed on and/or over semiconductor substrate 10 including metal wire 30. This may provide for formation of a vertical integration of an image sensor. Vertical integration of transistor circuitry and a photo diode may allow a fill factor to approach 100%, and may achieve higher sensitivity even without modifying a pixel size.

According to embodiments, respective unit pixels may implement a more complete circuitry without reduction in sensitivity, and may reduce processing costs while achieving at least the same resolution as provided in the related art.

According to embodiments, a photo diode may be formed inside a crystalline semiconductor substrate. This may reduce defects of a photo diode, while adopting a vertical photo diode structure. According to embodiments, a photo diode may be isolated for each unit pixel by a device isolation dielectric layer. This may reduce crosstalk and noise.

According to embodiments, a processes for forming via holes to expose a photo diode and a metal wire in a peripheral part in a device isolation dielectric layer may be performed, respectively. This may improve a quality of a device by preventing a change in size and position of via holes generated due to a step between a photo diode and an interlayer dielectric film in the peripheral part.

According to embodiments, additional on-chip circuitry may be integrated. This may improve a performance of an image sensor, and may achieve additional miniaturization of a device and a reduction in manufacturing costs.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method, comprising:
    forming a semiconductor substrate including a pixel part and a peripheral part;
    forming an interlayer dielectric film including a metal wire in the pixel part and a metal wire in the peripheral part over the semiconductor substrate;
    forming a photo diode pattern over the interlayer dielectric film connected to the metal wire in the pixel part;
    forming a device isolation dielectric layer over the interlayer dielectric film and the photo diode pattern;
    forming a first via hole over the device isolation dielectric layer to partially expose the photo diode pattern; and
    forming a second via hole over the device isolation dielectric layer to expose the metal wire in the peripheral part,
    wherein said forming a photo diode pattern comprises:
        forming a photo diode by performing an ion implantation over a crystalline semiconductor substrate;
        bonding the crystalline semiconductor substrate onto the semiconductor substrate;
        forming hard masks over the photo diode corresponding to locations of each of the metal wires in the pixel part; and
        forming a device isolation trench, which selectively exposes the interlayer dielectric film, by etching the photo diode using the hard masks as an etching mask.

2. The method of claim 1, wherein forming the photo diode patterns comprises removing the hard masks after forming the device isolation trench.

3. The method of claim 1, wherein forming the photo diode patterns comprises removing the crystalline semiconductor substrate so that only the photo diode remains after performing the bonding.

4. The method of claim 1, wherein an area of each hard mask is greater than an area of each metal wire.

5. The method of claim 1, wherein when the photo diode is etched, the interlayer dielectric film in the peripheral part is exposed.

6. The method of claim 1, wherein the photo diode pattern has a first height that is greater than a height of a surface of the interlayer dielectric film in the peripheral part.

7. The method of claim 6, wherein the first height is approximately 1.2 to 2.0 μm.

8. The method of claim 1, wherein forming the first via hole comprises:
    forming a photoresist pattern over the device isolation dielectric layer, the photoresist pattern including an opening over a portion of an area corresponding to the photo diode pattern; and
    forming the first via hole by etching the device isolation dielectric layer using the photoresist pattern as an etching mask.

9. The method of claim 1, wherein forming the second via hole comprises:
    forming a photoresist pattern over the device isolation dielectric layer, the photoresist pattern including an opening over a portion of an area corresponding to the metal wire in the peripheral part; and
    forming the second via hole by etching the device isolation dielectric layer using the photoresist pattern as an etching mask.

10. The method of claim 9, wherein the second via hole is formed by a separate process after the first via hole is formed.

11. The method of claim 1, wherein the device isolation dielectric layer comprises an oxide film.

* * * * *